US009310768B2

(12) United States Patent
Rakhovsky et al.

(10) Patent No.: US 9,310,768 B2
(45) Date of Patent: *Apr. 12, 2016

(54) METHOD FOR SYNTHESIS AND FORMATION OF A DIGITAL HOLOGRAM FOR USE IN MICROLITHOGRAPHY

(71) Applicant: Vadim Rakhovsky, Moscow (RU)

(72) Inventors: Vadim Rakhovsky, Moscow (RU); Mikhail Borisov, Moscow (RU); Aleksey Shamaev, Moscow (RU); Dmitry Chelyubeev, Dmitrov (RU); Aleksandr Gavrikov, Kemerovo (RU); Vitaly Chernik, Omsk (RU); Peter Mikheev, Moscow (RU)

(73) Assignee: Vadim Rakhovsky, Rockville, MD (US)

( * ) Notice: Subject to any disclaimer, the term of this patent is extended or adjusted under 35 U.S.C. 154(b) by 139 days.

This patent is subject to a terminal disclaimer.

(21) Appl. No.: 14/142,776

(22) Filed: Dec. 28, 2013

(65) Prior Publication Data

US 2015/0185695 A1 Jul. 2, 2015

(51) Int. Cl.
*G03H 1/22* (2006.01)
*G03H 1/08* (2006.01)
*G03F 7/20* (2006.01)
*G03H 1/00* (2006.01)

(52) U.S. Cl.
CPC .......... *G03H 1/0808* (2013.01); *G03F 7/70408* (2013.01); *G03H 2001/0094* (2013.01); *G03H 2210/45* (2013.01); *G03H 2260/63* (2013.01)

(58) Field of Classification Search
CPC ..... G03H 1/04; G03H 1/0402; G03H 1/0443; G03H 2001/0445; G03H 2001/0447; G03H 2001/045; G03H 2001/0452; G03H 1/08; G03H 1/0825; G03H 1/0866; G03H 1/0891; G03H 1/10; G03H 1/12; G03H 1/14; G03H 2210/11; G03H 2210/40; G03H 2223/00; G03H 2223/12; G03H 2223/13; G03H 2240/13
USPC ............................ 359/1, 9, 10, 11, 21, 32, 33
See application file for complete search history.

(56) References Cited

U.S. PATENT DOCUMENTS

| 8,542,421 | B2* | 9/2013 | Rosen et al. | 359/9 |
|---|---|---|---|---|
| 2010/0142014 | A1* | 6/2010 | Rosen et al. | 359/1 |
| 2011/0300490 | A1* | 12/2011 | Rachet et al. | 430/322 |
| 2015/0185696 | A1* | 7/2015 | Rakhovsky | 359/9 |
| 2015/0185697 | A1* | 7/2015 | Rakhovsky et al. | 359/9 |

\* cited by examiner

*Primary Examiner* — Bumsuk Won
*Assistant Examiner* — William R Alexander
(74) *Attorney, Agent, or Firm* — TransPacific Law Group; Pavel I. Pogodin, Esq.

(57) ABSTRACT

The invention describes a method of manufacturing a holographic mask capable of producing an image pattern that contains elements of a sub-wavelength size along with decreased deviations from the original pattern. The original pattern is converted into a virtual electromagnetic field and is divided into a set of virtual cells with certain amplitudes and phases, which are mathematically processed for obtaining the virtual digital hologram. The calculation of the latter is based on parameters of the restoration wave, which is used to produce the image pattern from the mask, and on computer optimization by variation of amplitudes and phases of the set of virtual cells and/or parameters of the virtual digital hologram for reaching a satisfactory matching between the produced image pattern and the original pattern. The obtained virtual digital hologram provides physical parameters of the actual digital hologram that is to be manufactured.

19 Claims, 8 Drawing Sheets

METHOD FOR SYNTHESIS AND FORMATION OF A DIGITAL HOLOGRAM FOR USE IN MICROLITHOGRAPHY

BACKGROUND OF THE INVENTION

1. Technical Field

The present invention relates to the semiconductor industry, in particular, to microlithography, and more specifically to a method for synthesizing a holographic photomask used for reconstructing the image recorded on the mask and for subsequently forming the image on the surface of a semiconductor wafer.

2. Description of the Related Art

Lithography and, in particular, photolithography is a well-known technique in semiconductor and printed circuit board (PCB) manufacture for creating electrical components and circuits. Photolithography involves placing a mask in front of a substrate, which has been covered by a layer of photoresist, before exposing both a mask and a substrate to light. The areas of photoresist that are exposed to light react and change chemical properties. The photoresist is then developed in order to remove either the exposed portions of photoresist for a positive resist or the unexposed portions for a negative resist. The pattern formed in the photoresist allows further processing of the substrate, such as, but not limited to, etching, deposition, or implantation.

One method of producing holographic images of integrated circuit (IC) topologies is disclosed in US Patent Application Publication 20110020736 (publication date of Jan. 27, 2011; inventors: Vadim Rakhovskiy, et al). As mentioned in this publication, design of ICs with a characteristic element dimension of 0.1 to 0.01 micron is a major promising direction in current microelectronics development. The high-precision technology (having submicron and micron tolerances) of making precise forms with 3D relief can be used in developing mass production of microrobotic parts, high-resolution elements of diffraction and Fresnel optics, and in other technical fields requiring 3D IC layout of a specified depth and with high resolution of its structures in the functional layer of a device. The latter can be used, for instance, to produce printing plates for banknotes and other securities.

Further progress of up-to-date microelectronics strongly depends on the microlithography process resolution that defines the development level of a majority of current science and technology fields. Microlithography involves coating a solid body (usually a substrate made of a semiconductor material) with a layer of a material sensitive to the used radiant flow, optical radiation, or electron beams. More often, however, a photoresist layer is used to produce an image that corresponds to a specified topology, for example, the topology of a certain layer of the IC being produced. Exposure of the photoresist through a pattern, usually called "a mask", makes this possible.

The positioning accuracy of the best projection scanning systems (steppers) made by ASML (The Netherlands), which is a leader in the field of microelectronics technology equipment, reaches 10 nm, which is explicitly insufficient for making VLSI ICs with a characteristic element dimension of 20 to 30 nm. The gap between of the steppers' abilities and the industry demand is intrinsic because three to five years are required to develop a stepper for submicron technologies and its cost for mass production, alone, is 10 to 70 million dollars, depending on the resolution required. The cost of development when added to the cost of production amounts to hundreds of millions of US dollars.

At present, photomicrolithography (or photolithography) is widely used in industry. The resolution $\Delta x$ that it provides is determined by the wavelength $\lambda$ of the radiation used and the numerical aperture NA of the projection system: $\Delta x = \kappa_1 \lambda / NA$ (W. Moro "Microlithography"; in 2 parts. Part 1: Transl. from English; Moscow. *MIR*, 1990, p. 478). Such dependence reasonably encouraged developers to use more and more shorter-wavelength radiation sources and more and more larger-aperture projection systems. As a result, for the last 40 years industrial projection photolithography has switched from using mercury lamps with a characteristic radiation wavelength of 330 to 400 nm to excimer lasers with an operating wavelength of 193 nm and even 157 nm. Projection lenses of modern steppers have reached 600 to 700 mm in diameter, which has caused a rapid increase in stepper cost.

The resolution increase results in a sharp decrease in focusing depth $\Delta F$ since $\Delta F = \pm \lambda / 2(NA)^2$ [p. 478[1]] which causes a reduction in output rate and a drastic complication in the focusing system of giant projection lenses and which, again, means higher costs of steppers. Moreover, the side effects limit using the apertures of such lenses during operation at maximum resolution.

In the development process of projection photolithography, the critical dimension of the projection parts decreased at an average of 30% every two years, thus doubling the quantity of transistors in an IC every 18 months (Moore's Law). Nowadays, "0.065 micron technology" is used in the industry, which makes it possible to print parts with a resolution of 65 nm. According to experts' opinions, the next milestone is the development of projection systems and radiation sources providing reliable resolution at a level of 22 nm. Currently, the successful development of projection lithography DUVL enabled to reach through <<multi patterning>> technology a resolution of 14 nm, whereas a switch to extreme ultraviolet (EUV) sources or even to soft X-ray radiation, will not be able to reach a goal of serial CD production until 2022. At present, only experiments with $\lambda = 13.4$ nm microlithography devices are being conducted. The first such device, as announced at the Intel Developer Forum (Intel™ is the world leader in VLSI IC production), already had been created and in 2002 it was used to produce transistors with a characteristic dimension of 50 nm. However, experts believe that the cost of such a stepper, even in case of its volume production, would reach 125 million USD, and, according to most optimistic estimates, five to ten years will be required to master the technology of mass production of microprocessors having critical dimensions at a level of 20 nm.

One of the most critical constraints of photolithography application is related to diffraction from the edges of a mask (diffraction from edges of the screen) used to attain a desired projecting image on a photoresist surface. As the monochromatism of used radiation increases, the above-stated effect deteriorates the quality of the received image due to occurrence of diffraction maximums placed at distances of the $\lambda$ order from the center of a projected line. If one takes into account that leading manufacturers currently use laser radiation with a wavelength $\lambda = 193$ nm and even less (in experimental steppers), the significance of the resolution constraint caused by diffraction on the mask edges becomes clear.

Thus, existing projection devices designed to generate images on a light-sensitive layer have a number of essential drawbacks, as follows.

1. Fundamental difficulties of combining high resolution and considerable depth of focus in one device.
2. Considerable complication in the design and technology of projection devices as the wavelength of radiation used to project an image onto a photoresist becomes shorter.

3. Drastic complication in the optical system and technology of producing a projected object (a mask) as the wavelength used for projection becomes shorter.

4. Significant increase in technological requirements and equipment prices as the integration scale in the manufactured products grows.

5. Extremely low technological flexibility in the production process and very high cost of its modification.

6. Unfeasibility in the principle of diversified manufacturing, i.e., fabrication of various ICs on the same substrate during a common technological process.

There is a method of producing a binary hologram by generating a plurality of transmission areas at specified locations or earlier calculated positions on a film. The hologram is opaque to the used radiation in such a way that when illuminated, these transmission areas make it possible to produce a holographic image at a predetermined distance from these areas (L. M. Soroko, "The Fundamentals of Holography and Coherent Optics"; Moscow, *Nauka*, 1971, pp. 420-434). This monograph considers the possibility of producing a "numeric" hologram, also called a "synthetic", "artificial", or "binary" hologram, and sets forth the theory with the conciseness and clarity peculiar to mathematic descriptions. However, the known method of making binary holograms—wherein the image of the transmission areas is produced, for example, by graphical means and then photographed with a significant reduction—does not provide a desired image quality and high resolution primarily because of insufficient accuracy in its production and an insufficient number of transmission areas.

There is a method for producing an image on material that is sensitive to used radiation by a hologram. In this method, exposure spots are generated by imaging at least one hologram placed in front of the radiation-sensitive material (GB 1331076 A, publ. Sep. 19, 1973[31]). However, the known method of using a hologram to provide an image on the material that is sensitive to used radiation does not allow production of high-quality images due to mutual overlapping of a plurality of diffraction orders, and due to the impossibility of using short-wave radiation sources. Moreover, the main objective of this method was to provide effective control of visually checked marks.

Also known is Russian Patent RU2396584 issued on Aug. 10, 2010 to M. Borisov, et al (equivalent to US Patent Application Publication 2011/0020736) which relates to a method for creating holographic images of drawings, wherein an image of the initial drawing is converted into a digital raster image. The diffraction pattern on each point of the future hologram is calculated, where the said diffraction pattern is created from all emitter elements of the digital raster image. Next to be calculated is the interference pattern obtained from interaction of the calculated diffraction pattern with the calculated wave front from a virtual reference point or extended radiation source, which is identical to the real wave front of the source and which will be used in producing the holographic image of the drawing. The result is used as a signal for modulating the radiation beam, which forms the diffraction structure of the hologram on a carrier. The hologram is composed of a set of discrete elements distinguished by their optical properties.

The apparatus for patterning a workpiece using an in-line holographic mask (ILHM) is disclosed in U.S. Pat. No. 5,015,049 issued to Byung J. Chang on May 14, 1991. This patent discloses a method of forming holographic optical elements free of secondary fringes. Holographic optical elements relatively free of unwanted, secondary fringes are produced by passing the light beam from a laser through a rotating diffusing plate to generate a beam of light having a very limited coherence length and a spatial coherence that changes over time. A photographic emulsion having a mirror supported on its reverse side is illuminated by the beam, and interference occurs between this primary illumination and illumination reflected from the mirror, thus creating fringes. No other interference fringes are formed because of the lack of coherence between secondary reflections and other rays of the incident beam. The rotation of the diffusion plate time-averages to zero any random interferences, thus eliminating the speckle pattern. Alternatively, the illuminating beam has a high degree of spatial coherence but its temporal coherence is reduced and varied over a period of time by changing the wavelength of a tunable-dye laser.

U.S. Pat. No. 6,618,174 issued on Sep. 9, 2003 to William P. Parker, et al, discloses an optically made, high-efficiency in-line holographic mask (ILHM) for in-line holographic patterning of a workpiece and apparatus and methods for performing same. The ILHM combines the imaging function of a lens with the transmission properties of a standard amplitude mask, obviating the need for expensive projection optics. The ILHM is either a type I (nonopaque) or type II (opaque) specialized object mask having one or more substantially transparent elements that can be phase-altering, scattering, refracting, and/or diffracting. A method of creating a pattern on a workpiece includes the steps of disposing an ILHM, disposing a workpiece adjacent to the ILHM and illuminating the ILHM to impart a pattern to the workpiece. In another method, the ILHM is used in combination with a lens. The ILHM is disposed such that a holographic real image is formed at or near the lens object plane, and the workpiece is disposed at or near the lens image plane.

U.S. Pat. No. 7,312,02 issued on Dec. 25, 2007 to Shih-Ming Chang discloses a hologram reticle and method of patterning a target. A layout pattern for an image to be transferred to a target is converted into a holographic representation of the image. A hologram reticle is manufactured that includes the holographic representation. The hologram reticle is then used to pattern the target. Three-dimensional patterns may be formed in a photoresist layer of the target in a single patterning step. These three-dimensional patterns may be filled to form three-dimensional structures. The holographic representation of the image may also be transferred to a top photoresist layer of a top surface imaging (TSI) semiconductor device, either directly or using the hologram reticle. The top photoresist layer may then be used to pattern an underlying photoresist layer with the image. The lower photoresist layer is used to pattern a material layer of the device.

A method of generating a holographic diffraction pattern and a holographic lithography system are disclosed also in US Patent Application Publication 2008/0094674 (published on Apr. 24, 2008; inventors are Alan Purvis, et al). The method involves defining at least one geometrical shape; generating at least one line segment to represent the at least one geometrical shape; calculating a line diffraction pattern on a hologram plane, including calculating the Fresnel diffraction equation for an impulse representing the at least one line segment with a line width control term and a line length control term; and adding vectorially, where there are two or more line segments, the line diffraction patterns to form the holographic diffraction pattern. The method and system enables holographic masks to be generated without creating a physical object to record. The required shapes or patterns are defined in terms of a three-dimensional coordinate space, and a holographic pattern is generated at a defined distance from the shapes in the coordinate space.

U.S. Pat. No. 7,722,997 issued on May 25, 2010 to Shih-Ming Chang, et al, discloses a hologram reticle and method of patterning a target. A layout pattern for an image to be transferred to a target is converted into a holographic representation of the image. A hologram reticle is manufactured that includes the holographic representation. The hologram reticle is then used to pattern the target. Three-dimensional patterns may be formed in a photoresist layer of the target in a single patterning step. These three-dimensional patterns may be filled to form three-dimensional structures. The holographic representation of the image may also be transferred to a top photoresist layer of a top surface imaging (TSI) semiconductor device, either directly or using the hologram reticle. The top photoresist layer may then be used to pattern an underlying photoresist layer with the image. The lower photoresist layer is used to pattern a material layer of the device.

SUMMARY OF THE INVENTION

The invention is aimed at obtaining a holographic mask capable of producing an image pattern that contains elements of a sub-wavelength size along with high technological parameters and with reduction of deviations from the specified pattern, improved image contrast, and noise-level reduction in illuminated and non-illuminated areas of the pattern.

This result is achieved due to the fact that the original image is converted into a set of virtual cells, the information about the amplitude and phase that characterize each cell is recorded as a point or an extended light source, and the parameters of the physical structure of the mask that is to be used for calculating the electromagnetic field to be generated on the surface of the photosensitive material during illumination of the mask are determined. Following this, a process for creating the final image on the basis of the electromagnetic field is modulated in digitized form, and the obtained model is compared with the original pattern. If a deviation of the obtained model from the original pattern exceeds a given one, parameters of the unit cells and/or parameters of the holographic-mask physical structure are corrected, and the procedure is repeated until the required level of matching is achieved. The obtained final parameters of the physical structure of the holographic mask are used for manufacturing the actual digital hologram (ADH) on a hologram manufacturing apparatus.

BRIEF DESCRIPTION OF THE DRAWINGS

The accompanying drawings, which are incorporated in and constitute a part of this specification exemplify the embodiments of the present invention and, together with the description, serve to explain and illustrate principles of the inventive technique. Specifically.

DETAILED DESCRIPTION

In the following detailed description, reference will be made to the accompanying drawing(s), in which identical functional elements are designated with like numerals. The aforementioned accompanying drawings show by way of illustration, and not by way of limitation, specific embodiments and implementations consistent with principles of the present invention. These implementations are described in sufficient detail to enable those skilled in the art to practice the invention and it is to be understood that other implementations may be utilized and that structural changes and/or substitutions of various elements may be made without departing from the scope and spirit of present invention. The following detailed description is, therefore, not to be construed in a limited sense.

In order to understand the principle of the present invention, it is advisable first to more clearly understand and formulate the problem that must be solved by the proposed method. It should be noted that in spite of the fact that the problem of synthesis of a holographic mask is a major one for use in holographic photolithography, it is a very specific one from the point of view of holography as a whole.

An endless amount of methods for mathematical synthesis of approximation to a holographic pattern exists. Some of these methods are presented in patent publications listed above. Furthermore, these methods differ from each other in details. However, the majority of these methods do not allow calculation of a holographic pattern for a time acceptable for practical industrial application because even an insignificant increase in pattern dimensions leads to a catastrophic increase in computing power. That is why until now, in spite of attractiveness of the aforementioned methods, they did not find practical application.

The method of the invention for holographic synthesis of digital holograms for use in microlithography proposed by the inventors decreases synthesis time by a factor of 10 or greater.

The method of the invention is described in more detail below in the form of sequential steps designated in alphabetic order.

Figure 1:
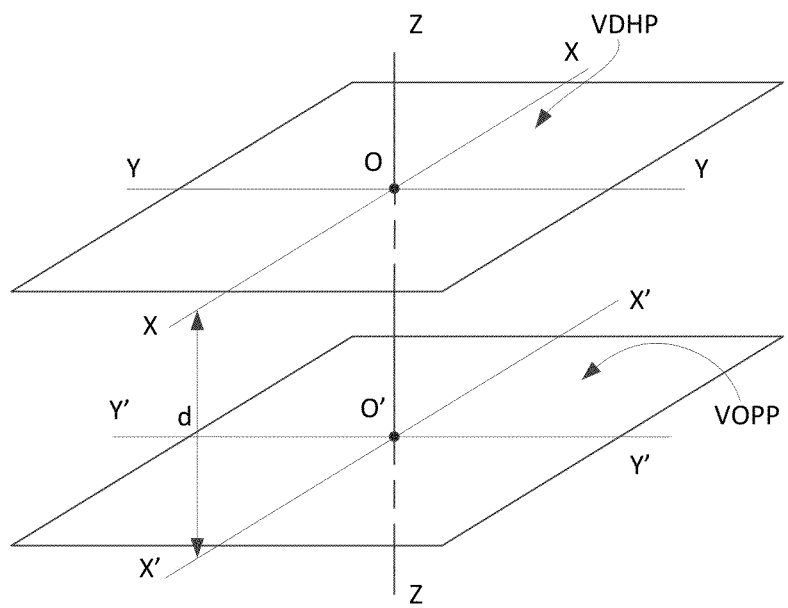
FIG. 1 is a perspective view of relative positions of a virtual hologram plane (VDHP) and a virtual original pattern plane in an X, Y, Z coordinate system.

The first step (a) consists of introducing an orthogonal coordinate system x, y, z having three mutually perpendicular axes X-X, Y-Y, and Z-Z, choosing a point O (see FIG. 1) on the axis Z-Z, and passing through this point O a virtual digital hologram plane (VDHP), which is perpendicular to the axis Z-Z and which is to be used as a plane of a virtual digital hologram (VDH) for assisting in manufacture of the actual digital hologram (not shown in FIG. 1).

The next step (b) consists of selecting an orthogonal coordinate system x', y', z having three mutually perpendicular axes X'-X', Y'-Y', and Z-Z, choosing a point O' on the axis Z-Z, which is spaced from the virtual digital hologram plane (VDHP) at a certain distance "d", and passing through this point O' a virtual original pattern plane (VOPP), which contains a virtual original pattern and is perpendicular to said arbitrary axis Z-Z, and wherein the virtual original pattern that contains image elements is to be used for subsequent synthesis of the virtual digital hologram.

Figure 2:
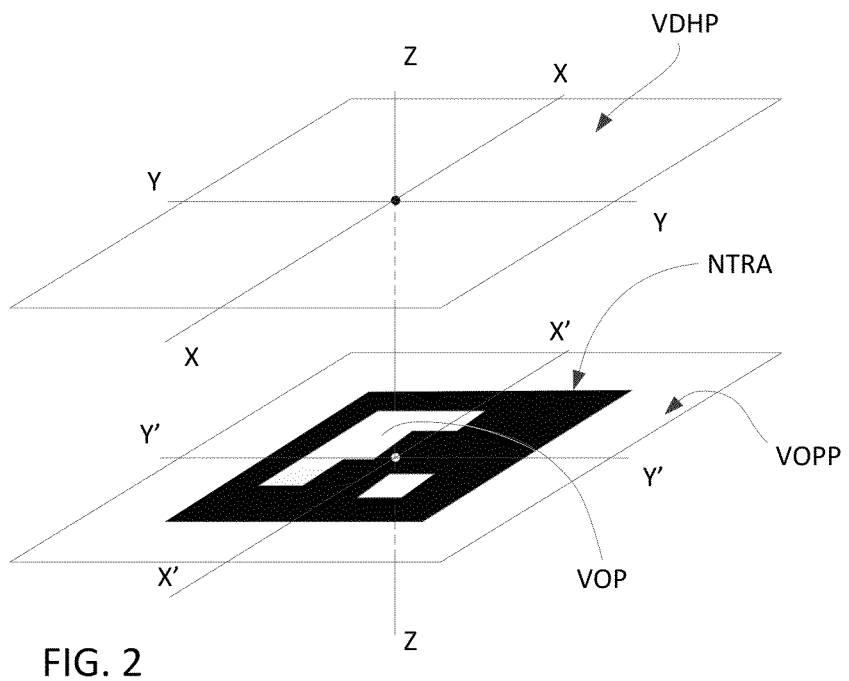
FIG. 2 is a perspective view of the position of a nontransparent restricted area (NTRA) in the virtual original pattern plane (VOPP) and position of the virtual original pattern (VOP) in the nontransparent restricted area (NTRA) of the virtual original pattern plane (VOPP).

The next step (c), which is shown in FIG. 2, consists of selecting a nontransparent restricted area (NTRA) in the virtual original pattern plane (VOPP) and placing the virtual original pattern (VOP) in the nontransparent restricted area (NTRA) of the virtual original pattern plane (VOPP). The virtual original pattern (VOP) is formed by virtual image elements (VIE).

Figure 3:
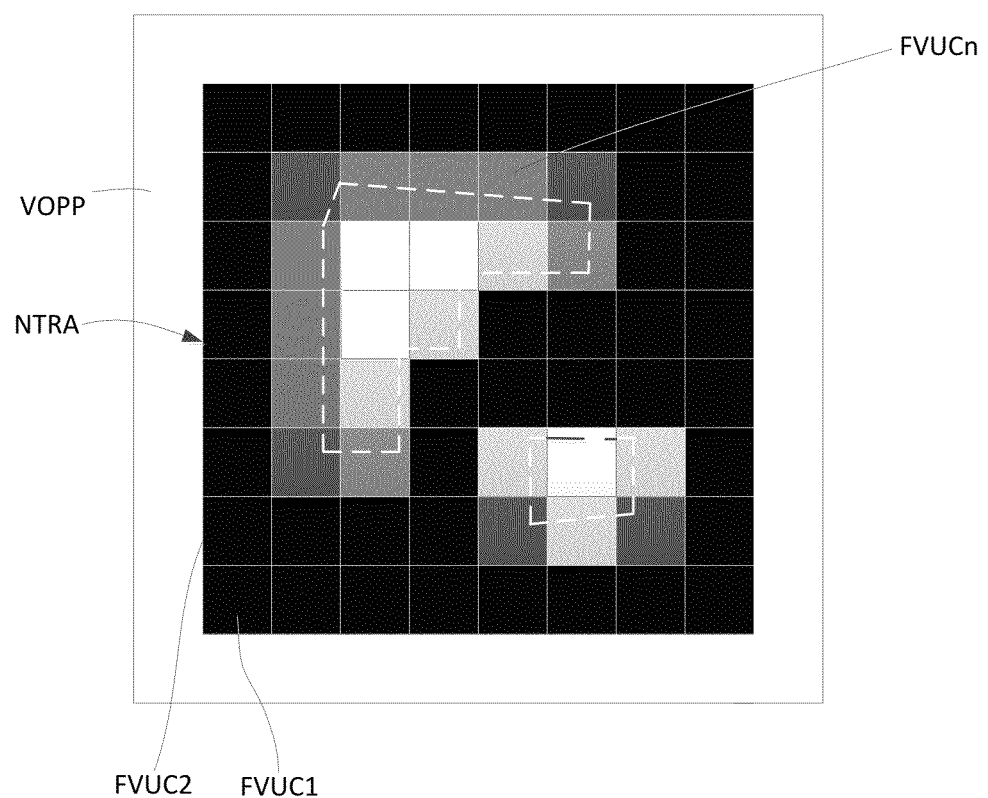
FIG. 3 is a top view of a step in which the first virtual net (FVN), which divides the nontransparent restricted area (NTRA) into a plurality of first virtual unit cells (FVUC1, FVUC2, . . . FVUCm), is applied onto the virtual original pattern plane (VOPP).

In the next step (d), which is shown in FIG. 3, a first virtual net (FVN), which divides the nontransparent restricted area (NTRA) into a plurality of first virtual unit cells (FVUC1, FVUC2, . . . FVUCm), is applied onto the virtual original pattern plane (VOPP).

In the next step (e), the first virtual unit cells (FVUC1, FVUC2, . . . FVUCm) are classified into white first virtual unit cells such as a first white virtual unit cell (WFUC), black first virtual unit cells such as (BFUC), and grey first virtual unit cells such as (GFUC) (FIG. 3), wherein a white first virtual unit cell is obtained if a first virtual unit cell of the first net overlaps the virtual image elements of the original pattern, a black first virtual unit cell is obtained if a first virtual unit cell of the first net overlaps only a space between the adjacent virtual image elements, and a grey virtual unit cell is obtained if a first virtual unit cell of the first net overlaps both virtual image elements and a space between adjacent virtual image elements.

Figure 4:
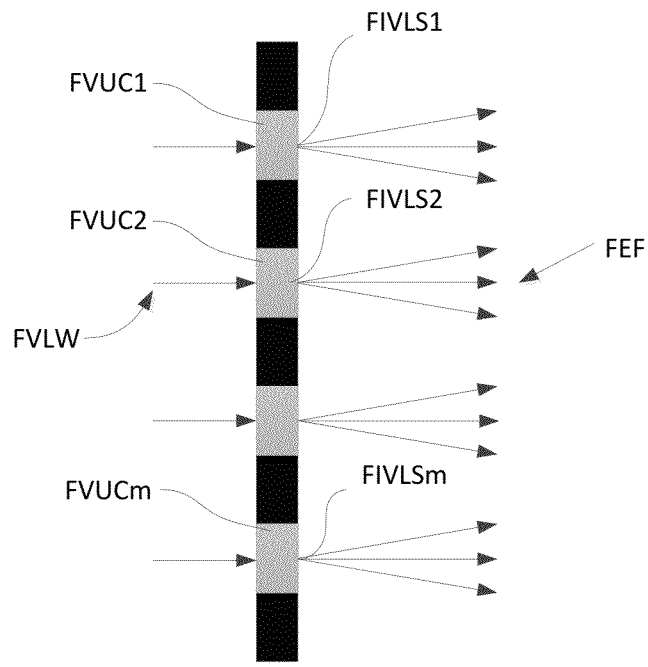
FIG. 4 is a side view showing passage of the first virtual light wave (FVLW) through the first virtual unit cells.

The next step (f) consists of presenting the virtual original pattern (VOP) in the form of a virtual digital amplitude-phase mask, wherein each first virtual unit cell is assigned a transmission value, wherein white first virtual unit cells (WFUC) are assigned a transmission value of 1.0, black first virtual unit cells (BFUC) are assigned a transmission value of 0.0, and grey first virtual unit cells (GFUC) are assigned a transmission value in the range of 0.0 to 1.0; all areas beyond the restricted area are assigned an amplitude value of 0.0; and wherein each first virtual unit cell has a function of a rotational phase shifter for shifting the phase in each respective first virtual unit cell when this first virtual unit cell passes the light of a first virtual light wave FVLW (FIG. 4) that has a given phase, amplitude and directional characteristic, which are changed individually in each first virtual unit cell when the first virtual light wave (FVLW) passes through this cell, whereby a plurality of first individual virtual light sources (FIVLS1, FIVLS2, . . . FIVLSm) selected from the group of point light sources and/or extended light sources is formed, wherein each first individual virtual light source of said plurality acquires a pre-calculated phase, amplitude and directional characteristic.

In the next step (g), an auxiliary correction of said acquired pre-calculated phase, amplitude and directional characteristic is performed for each first individual virtual light source of said plurality for obtaining a post-calculated distribution of said phase, amplitude and directional characteristic of the first individual virtual light sources (FIVLS1, FIVLS2, . . . FIVLSm) of said plurality.

The next step (h) consists of fixing obtained post-calculated distribution of said phase, amplitude and directional characteristic of the first individual virtual light sources (FIVLS1, FIVLS2, . . . FIVLSm) of said plurality, said first individual virtual light sources (FIVLS1, FIVLS2, . . . FIVLSm) generating a first electromagnetic field (FEF) in the virtual original pattern plane (VOPP).

In the next step (i), a second virtual net that divides the plane of a virtual digital hologram into a plurality of second virtual unit cells is applied onto the plane of the virtual digital hologram. This step is not illustrated because it looks similar to one shown in FIG. 3. In the second virtual units of the virtual digital hologram plane (VDHP), the first light sources of said plurality generate a second electromagnetic field (SEF).

The step (j) consists of calculating amplitude and phase of the second electromagnetic field (SEF) in the virtual digital hologram plane (VDHP) from the first light sources of said plurality.

Figure 5:
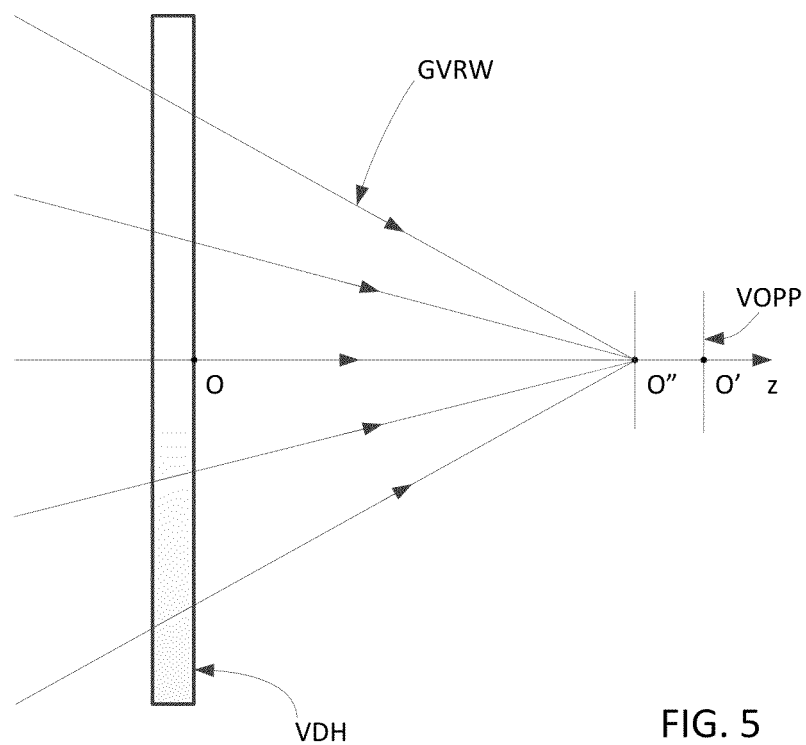
FIG. 5 is a side view that shows passage of a given virtual restoration wave ((GVRW)) through the virtual digital hologram for subsequent restoration of a final virtual image (FVI).

The next step (k) which is shown in FIG. 5, consists of providing a given virtual restoration wave (GVRW) for subsequent restoration of a final virtual image FVI. This drawing shows that the given virtual restoration wave (GVRW) propagates in the direction from (VDHP) to (VOPP) and comprises a spherical or near-spherical wave (or, in a general case, a non-spherical wave) that converges to point O", which may or may not coincide with point O' on the virtual original pattern plane (VOPP). Designations (VDH), (VOPP), O, O', and z are the same as in FIG. 1.

Figure 6:
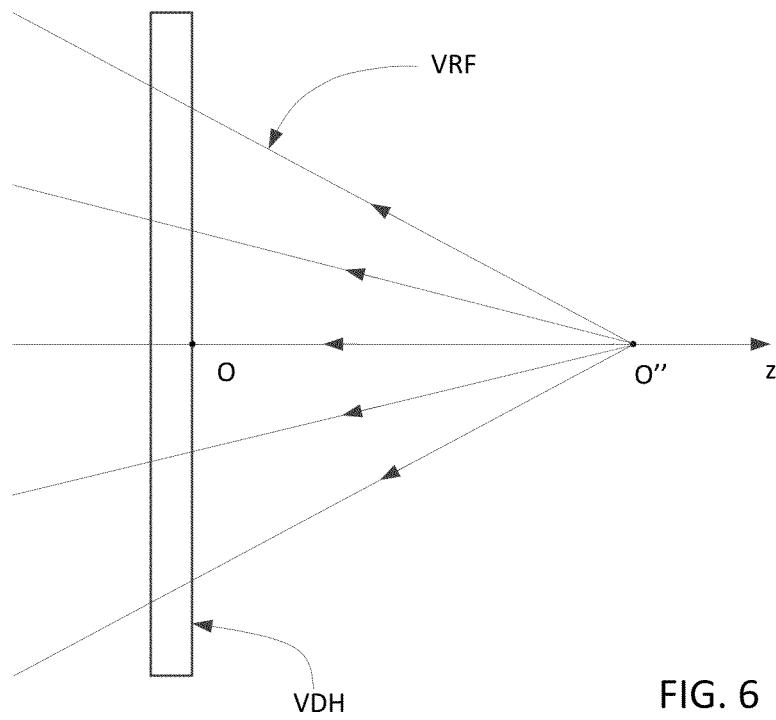
FIG. 6 is a side view that shows inversion of the given virtual restoration wave ((GVRW)) into a virtual reference wave (VRF) to be used for calculating the virtual digital hologram (VDH).

The next step (l) (FIG. 6) is inverting the given virtual restoration wave (GVRW) into a virtual reference wave (VRF) to be used for calculating the virtual digital hologram (VDH).

Figure 7:
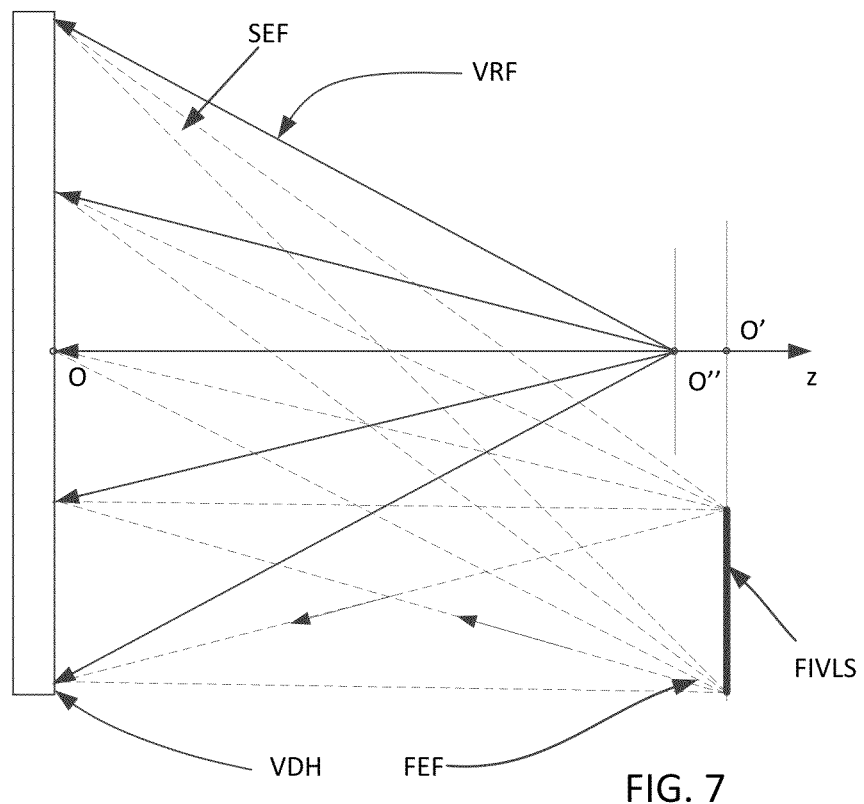
FIG. 7 is a side view that shows an addition of the virtual reference wave (VRF) to the second electromagnetic field (SEF) obtained in the second virtual unit cells.

In the next step (m), the virtual reference wave (VRF) is added to the second electromagnetic field (SEF) obtained in the second virtual unit cells for calculating interference amplitudes and phases obtained as a result of interference of the second electromagnetic field (SEF) obtained from the first virtual light sources with the virtual reference wave VRF. This is shown in FIG. 7. This drawing illustrates a case wherein point O" is in the virtual original pattern plane (VOPP).

The next step (n) consists of calculating the values of the virtual digital hologram (VDH) in the second virtual unit cells based on the interference amplitudes and phases in each second virtual unit cell.

Figure 8:
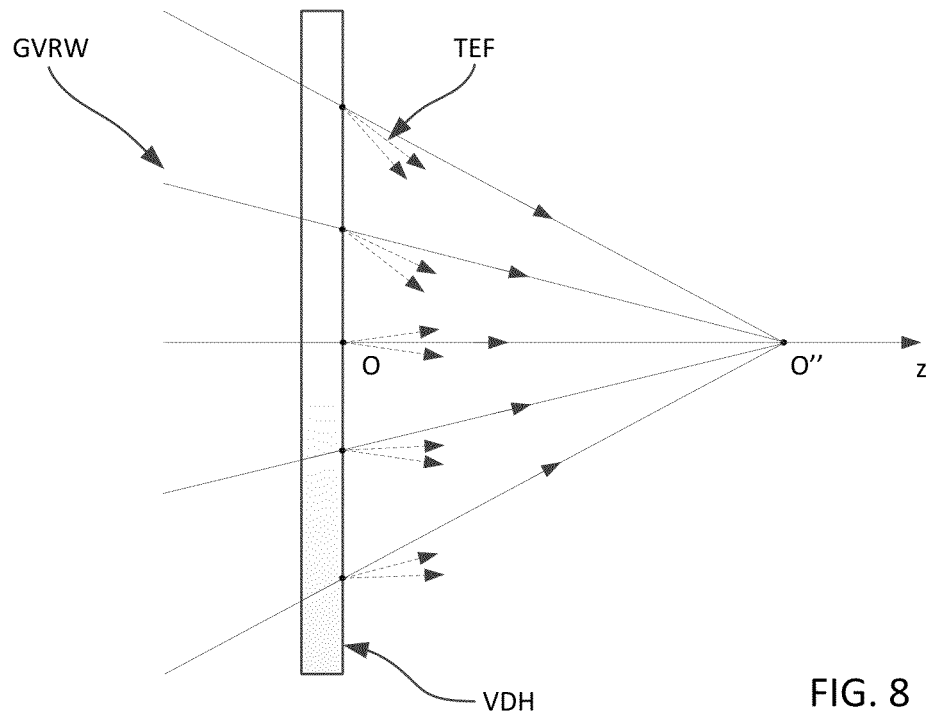
FIG. 8 is a side view that shows passage of a given virtual restoration wave ((GVRW)) through the virtual digital hologram plane (VDHP) for forming a plurality of second individual virtual light sources in the second virtual unit cells.

Next, in step (o) (FIG. 8), the given virtual restoration wave (GVRW) passes through the virtual digital hologram plane (VDHP), thus forming a plurality of second individual virtual light sources (SIVLS1, SIVLS2, . . . SIVLSk) in the second virtual unit cells. The second individual virtual light sources (SIVLS1, SIVLS2, ... SIVLSk) generate a third electromagnetic field (TEF) in the virtual digital hologram plane (VDHP).

In step (p), a final virtual image plane (FVIP) is selected for subsequent formation of the final virtual image. This plane may or may not coincide with the virtual original pattern plane (VOPP).

The next step (q) consists of applying a third virtual net onto final virtual image plane (FVIP), whereby a plurality of third virtual unit cells is formed. (This step is not illustrated because it is similar to one shown in FIG. 3). In the third virtual unit cells, the second individual light sources (SIVLS1, SIVLS2 ... SIVLSk) generate a fourth electromagnetic field (REF).

Figure 9:
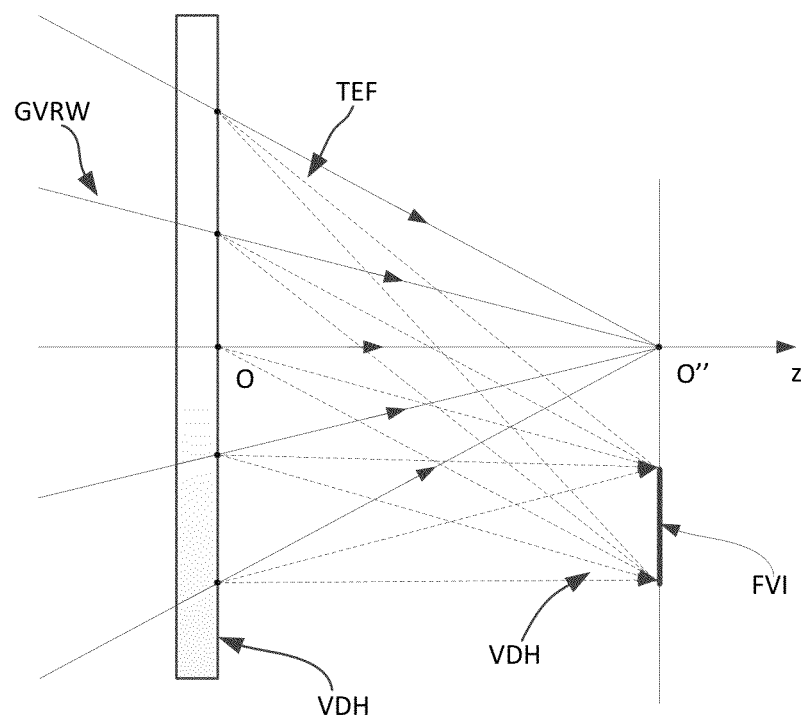
FIG. 9 is a side view of a step at which amplitudes and phases of the fourth electromagnetic field (REF) are calculated.

Step (r), which is shown in FIG. 9, consists of calculating amplitudes and phases of the fourth electromagnetic field (REF). This drawing illustrates a case wherein point O'' is in the final virtual image plane.

Figure 10:
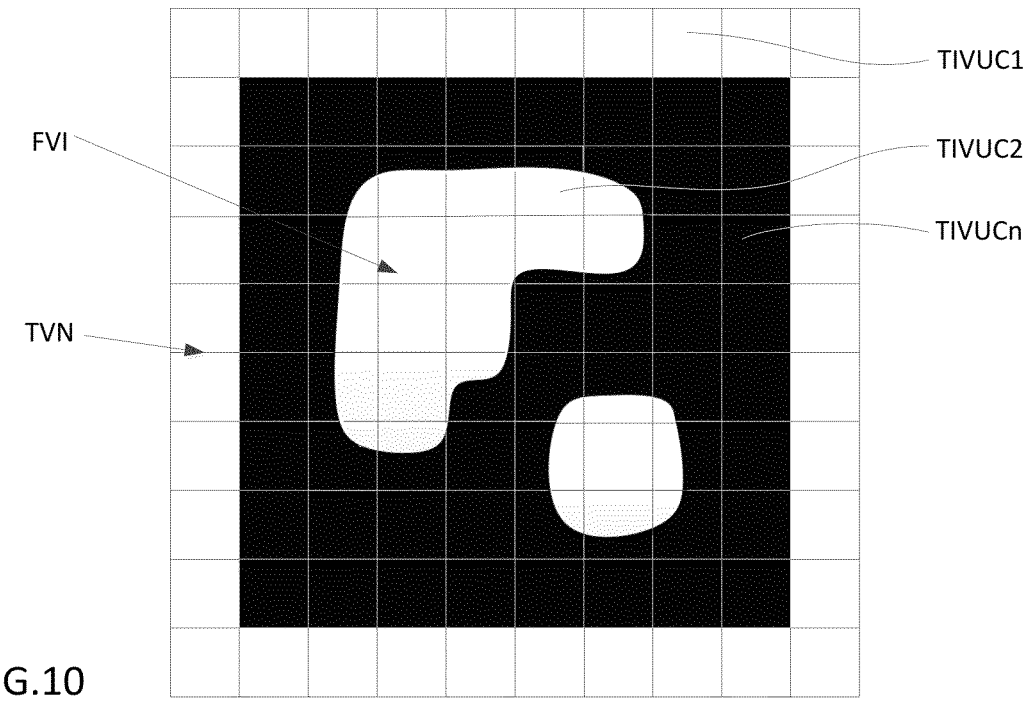
FIG. 10 is a plan view illustrating results of the step in the values of the final virtual image (FVI) are calculated in the third virtual unit cells based on amplitudes and phases of the fourth electromagnetic field (REF).

Step (s), which is shown in FIG. 10, consists of calculating the values of the final virtual image FVI in the third virtual unit cells (TIVUC1, TIVUC2, ... TIVUCn) based on amplitudes and phases of the fourth electromagnetic field (REF) calculated in step (r).

Figure 11:
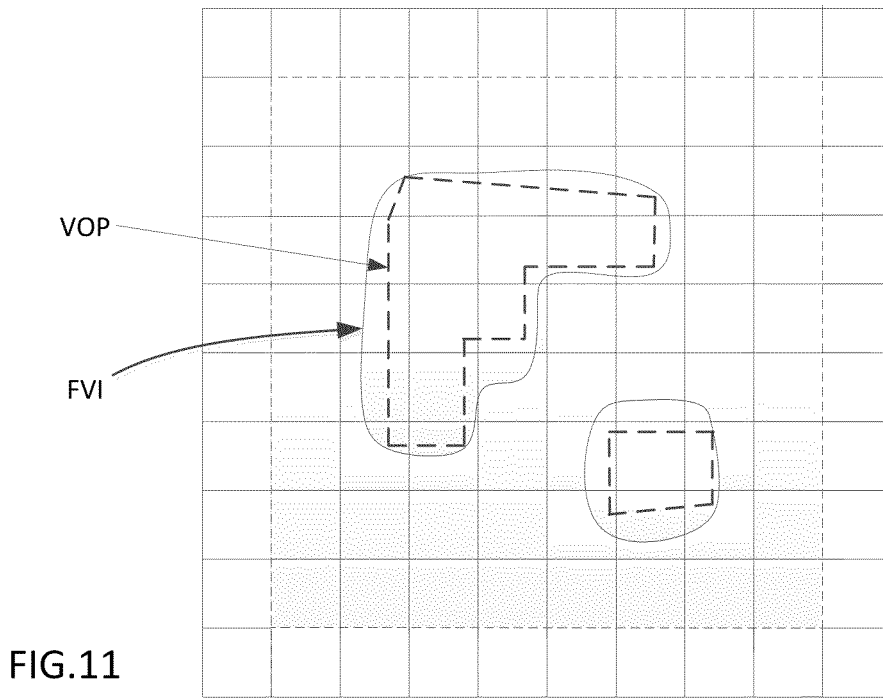
FIG. 11 illustrates introduction of a criterion for comparing the final virtual image (FVI) and the virtual original pattern (VOP).

Step (t) consists of introducing a criterion for matching the final virtual image (FVI) and the virtual original pattern (VOP) (FIG. 11).

In step (u) the final virtual image (FVI) is compared with the virtual original pattern (VOP) (FIG. 11) based on the criterion of matching if deviations are obtained.

Step (v) is minimizing the above deviation, if any, by repeating steps (g), (h), (j), (m), (n), (o), (r), (s), and (u) until a satisfactory value of the criterion of matching is achieved, thus obtaining the final virtual digital hologram.

Figures 12A, 12B, 12C:
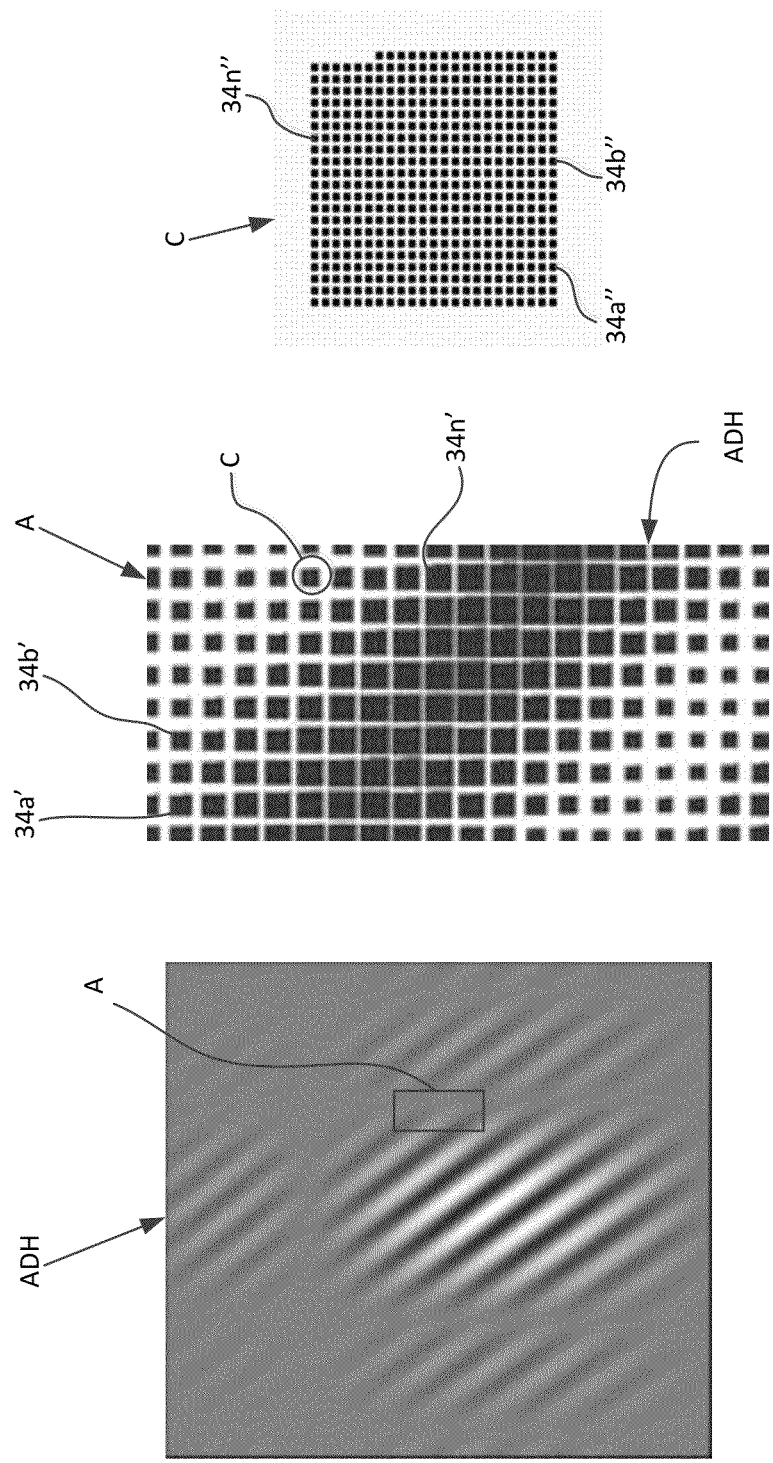
FIG. 12A is a top view of an actual digital hologram.
FIG. 12B is a top view of a rectangular area A marked in FIG. 12A that shows a plurality of holes of different dimensions formed in the nontransparent layer described in connection with FIG. 13.
FIG. 12C is a top view of an area C marked in FIG. 12B shown on a larger scale.

The final step (w) consists of manufacturing the actual digital hologram (ADH) on a hologram manufacturing apparatus (not shown) based on the final virtual digital hologram. FIG. 12A is a top view of an actual digital hologram (ADH). FIG. 12B is an enlarged picture of the rectangular area A marked in FIG. 12A.

According to one or several aspects of the invention, the electromagnetic field generated by the plurality of the first individual virtual light sources (FIVLS1, FIVLS2, ..., FIVLSm) in a certain plane, which is spaced at a certain distance from the plane (VOPP), can be expressed in a scalar approximation by formula (1):

$$u(x, y, z) = \int_{-\infty}^{\infty}\int_{-\infty}^{\infty} V(x', y') G(x - x', y - y', z) dx' dy' \quad (1)$$

where:
V(x',y') is an electromagnetic field in the (VOPP) plane (in other words, the distribution of phases and amplitudes of this electromagnetic field is equivalent to those of the first individual virtual light sources (FIVLS1, FIVLS2, ..., FIVLSm), themselves).

$$G(x, y, z) = -\frac{\partial}{\partial z}\left(\frac{e^{ikr}}{2\pi r}\right);$$

where:

$r = \sqrt{x^2 + y^2 + z^2}$, and k is a wave number equal to $2\pi/\lambda$.

In the case illustrated in FIGS. 1 to 3, the aforementioned certain plane is the virtual digital hologram plane (VDHP) that is spaced from the virtual original pattern plane (VOPP) at distance d.

Therefore, formula (1) can be written as follows:

$$U(x, y) = \int\int_S V(x', y') G(x - x', y - y', d) dx' dy' \quad (2)$$

where:
S is the nontransparent restricted area (NTRA) shown in FIG. 2.

According to another aspect of the invention, numerical calculation of the amplitude and phase in the second virtual unit cells is carried out based on the fast Fourier transform.

According to one or several aspects of the invention, in the formation of the final actual virtual image (FAIFVI), the aforementioned given virtual restoration wave is identical to the actual restoration wave (ARW), which is used to illuminate the actual digital hologram (ADH) and to obtain the final actual image (FAI).

Figure 13:
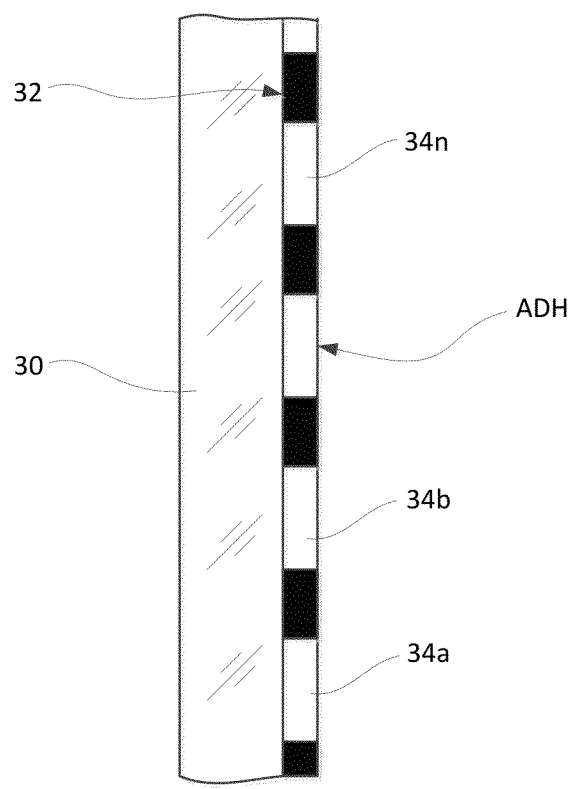
FIG. 13 is a sectional view of the final actual hologram with a set of holes of equal dimensions formed in the nontransparent layer for changing the amplitude of the actual restoration wave.

The actual digital hologram (ADH) is made in the form of a set of holes formed in a nontransparent layer. This is shown in FIG. 13, which is a fragment of a cross section through the actual digital hologram. In this drawing, reference numeral 30 designates a transparent substrate made, e.g., from fused silica (quartz), reference numeral 32 designates a nontransparent layer applied onto the transparent layer 30, and reference numerals 34a, 34b, ... 34n designate holes made in the nontransparent layer 32.

As shown in FIG. 12B, the actual digital hologram (ADH) can be made in the form of a set of holes 34a', 34b', ... 34n' of a variable size formed in a nontransparent layer 32', where one such hole of a predetermined size corresponds to an appropriate second virtual unit cell of the virtual digital hologram.

FIG. 12C is a top view of an area C marked in FIG. 12B shown on a larger scale. In the illustrated case the area C of FIG. 12B comprises a single unit cell of the ADH that corresponds to one of the second virtual unit cells mentioned in step i) of the method of the invention. This cell contains "n" holes such a hole 34a'', 34b'', ... 34n''. In fact, the number of the hole may vary from 1 to "n" or greater.

Although the invention has been shown and described with reference to specific embodiments, it is understood that these embodiments should not be construed as limiting the areas of application of the invention and that any changes and modifications are possible, provided that these changes and modifications do not depart from the scope of the attached patent claims. Thus, the following criteria can be used for evaluating the level of matching of the final virtual image (FVI) to the virtual original pattern (VOP): a maximal difference of intensities or amplitudes in the unit cells that coincide in coordinates of the virtual original pattern (VOP) and the final virtual image (FVI); a sum of absolute differences in (a) intensities or (b) amplitudes of all cells of virtual original pattern (VOP) and the final virtual image (FVI); a sum of squared differences in (a) intensities or (b) amplitudes of all cells of virtual original pattern (VOP) and the final virtual image (FVI); a sum of arbitrary degree differences in (a) intensities or (b) amplitudes of all cells of virtual original pattern (VOP) and the final virtual image (FVI). The criteria for matching the final virtual image (FVI) and the virtual original pattern (VOP) can also comprise a mathematical model of interaction between the fourth electromagnetic field (REF) and the exposed photosensitive material. Corrections of the first individual virtual light sources (FIVLS1, FIVLS2, . . . FIVLSm) can be made by a local variation comparison method or by any gradient method. The virtual digital hologram can also be corrected by a method of local variations or by any gradient method. The identities of the given virtual restoration wave (GWRV) and the actual restoration wave (ARW), which are used in the photolithography apparatus for illuminating the actual digital hologram (ADH) and obtaining the final actual image, are provided by an accurate aberration calculation of the optical system or by measuring the wave front of the actual restoration wave (ARW).

What is claimed is:

1. A method for synthesis and formation of a digital hologram for use in microlithography comprising the following steps:

(a) introducing an orthogonal coordinate system x, y, z having three mutually perpendicular axes X-X, Y-Y, and Z-Z, choosing a point O on the axis Z-Z, and passing through this point a virtual digital hologram plane (VDHP), which is perpendicular to the axis Z-Z and which is to be used as a plane of a virtual digital hologram (VDH) for manufacturing the actual digital hologram;

(b) selecting an orthogonal coordinate system x', y', z having three mutually perpendicular axes X'-X', Y'-Y', and Z-Z, choosing a point O' on the axis Z-Z that is spaced from the virtual digital hologram plane (VDHP) at a certain distance "d" and passing through this point O' a virtual original pattern plane (VOPP) that contains a virtual original pattern and is perpendicular to said arbitrary axis Z-Z, and wherein the virtual original pattern that contains image elements is to be used for subsequent synthesis of the virtual digital hologram;

(c) selecting a nontransparent restricted area NTRA in the virtual original pattern plane (VOPP) and placing the virtual original pattern (VOP) in the nontransparent restricted area NTRA of the virtual original pattern plane (VOPP), the virtual original pattern (VOP) being formed by virtual image elements VIE;

(d) applying onto the virtual original pattern plane (VOPP) a first virtual net FVN that divides the non-transparent restricted area (NTRA) into a plurality of first virtual unit cells;

(e) classifying the first virtual unit cells into white first virtual unit cells, black first virtual unit cells, and grey first virtual unit cells, wherein a white first virtual unit cell is obtained if a first virtual unit cell of the first net overlaps the virtual image elements of the virtual original pattern, a black first virtual unit cell is obtained if a first virtual unit cell of the first net overlaps only a space between the adjacent virtual image elements, and a grey virtual unit cell is obtained if a first virtual unit cell of the first net overlaps adjacent virtual image elements and a space between the adjacent virtual image elements;

(f) presenting the virtual original pattern (VOP) in the form of a virtual digital amplitude-phase mask, wherein each first virtual unit cell is assigned a transmission value so that white first virtual unit cells are assigned a transmission value of 1.0, black first virtual unit cells are assigned a transmission value of 0.0, and grey first virtual unit cells are assigned a transmission value in the range of 0.0 to 1.0; all areas beyond the restricted area are assigned an amplitude value of 0.0; and wherein each first virtual unit cell has a function of a rotational phase shifter for shifting the phase in each respective first virtual unit cell when this first virtual unit cell passes the light of a first virtual light wave that has a given phase and amplitude, which are changed individually in each first virtual unit cell when the first virtual light wave FVLW passes through this cell, whereby a plurality of first individual virtual light sources selected from the group of point light sources and/or extended light sources is formed, and wherein each first individual virtual light source of said plurality acquires a precalculated phase and amplitude;

(g) carrying out an auxiliary correction of said acquired precalculated phase and amplitude for each first individual virtual light source of said plurality for obtaining a post-calculated distribution of said phase and amplitude of the first individual virtual light sources of said plurality;

(h) fixing the obtained post-calculated distribution of said phase and amplitude of the first individual virtual light sources of said plurality, said first individual virtual light sources generating a first electromagnetic field;

(i) applying a second virtual net onto the plane of the virtual digital hologram, thus dividing the plane of the virtual digital hologram into a plurality of second virtual unit cells and generating with the first light sources of said plurality a second electromagnetic field in the second virtual unit cells of the virtual digital hologram plane;

(j) calculating an amplitude and phase of the second electromagnetic field in the virtual digital hologram plane from the first light sources of said plurality;

(k) providing a given virtual restoration wave that propagates from the virtual digital hologram plane to the virtual original pattern plane for subsequent restoration of the final virtual image and comprises a spherical or a non-spherical wave that converges to point O", which may or may not coincide with point O' on the virtual original pattern plane (VOPP);

(l) inverting the given virtual restoration wave into a virtual reference wave to be used for calculating the virtual digital hologram;

(m) adding the virtual reference wave to the second electromagnetic field obtained in the second virtual unit cells for calculating interference amplitudes and phases obtained as a result of interference of the second electromagnetic field obtained from the first virtual light sources with the virtual reference wave;

(n) calculating the values of the virtual digital hologram in the second virtual unit cells based on the interference amplitudes and phases in each second virtual unit cell;

(o) passing the given virtual restoration wave through the virtual digital hologram plane, thus forming a plurality of second individual virtual light sources in the second unit cells, the second individual virtual light generating a third electromagnetic field in the virtual digital hologram plane;

(p) selecting a final virtual image plane for subsequent formation of the final virtual image, the final virtual image plane coinciding or not coinciding with the virtual original pattern plane (VOPP);

(q) applying a third virtual net onto the final virtual image plane, thus forming a plurality of third virtual units, the second individual light sources generating a fourth electromagnetic field in the third virtual unit cells;

(r) calculating amplitudes and phases of the fourth electromagnetic field;

(s) calculating the values of the final virtual image in the third virtual unit cells based on amplitudes and phases of the fourth electromagnetic field (REF) calculated in step (r);

(t) introducing a criterion of matching between the final virtual image and the virtual original pattern;

(u) comparing the final virtual image with the virtual original pattern based on the criterion of matching if deviations are present;

(v) minimizing the above deviation, if any, by repeating the steps (g), (h), (j), (m), (n), (o), (r), (s), and (u) until a satisfactory value of the criterion of matching is achieved and thus obtaining the final virtual digital hologram; and (w) manufacturing the actual digital hologram with use of the obtained final virtual digital hologram.

2. The method of claim 1, wherein the second electromagnetic field generated in the virtual digital hologram plane (VDHP) by a plurality of the first individual virtual light sources is expressed by the following formula (2):

$$U(x, y) = \int\int_S V(x', y')G(x - x', y - y', d)dx'dy' \quad (2)$$

where:

V(x,y) is an electromagnetic field in the virtual original pattern plane (VOPP);

$$G(x, y, z) = -\frac{\partial}{\partial z}\left(\frac{e^{ikr}}{2\pi r}\right);$$

where:

$r = \sqrt{x^2 + y^2 + z^2}$ k is a wave number equal to $2\pi/\lambda$, and
S is the nontransparent restricted area.

3. The method of claim 1, wherein numerical calculation of the amplitude and phase in the second virtual units is carried out based on the fast Fourier transform.

4. The method of claim 2, wherein numerical calculation of the amplitude and phase in the second virtual units is carried out based on the fast Fourier transform.

5. The method of claim 1, wherein the aforementioned given virtual restoration wave is identical to an actual restoration wave (ARW), which is used for illuminating the actual digital hologram (ADH) and obtaining the final actual image.

6. The method of claim 2, wherein the aforementioned given virtual restoration wave is identical to an actual restoration wave (ARW), which is used for illuminating the actual digital (ADH) and obtaining the final actual image.

7. The method of claim 3, wherein the aforementioned given virtual restoration wave is identical to an actual restoration wave (ARW), which is used for illuminating the actual digital hologram (ADH) and obtaining the final actual image.

8. The method of claim 4, wherein the aforementioned given virtual restoration wave is identical to an actual restoration wave (ARW), which is used for illuminating the actual digital hologram (ADH) and obtaining the final actual image.

9. The method of claim 1, wherein the actual digital hologram is produced in the form of an amplitude layer having local regions that change the amplitude of the actual restoration wave (ARW) and each of which corresponds to a respective second virtual unit cell.

10. The method of claim 9, wherein the actual digital hologram (ADH) comprises a transparent substrate and a nontransparent layer formed on the transparent substrate and wherein the local regions that change the amplitude of the actual restoration wave (ARW) comprise a set of holes formed in the nontransparent layer.

11. The method of claim 10, wherein the holes are selected from the group consisting of holes of equal or different dimensions.

12. The method of claim 2, wherein the actual digital hologram is produced in the form of an amplitude layer having local regions that change the amplitude of the actual restoration wave (ARW) and each of which corresponds to a respective second virtual unit cell.

13. The method of claim 12, wherein the actual digital hologram (ADH) comprises a transparent substrate and a nontransparent layer formed on the transparent substrate and wherein the local regions that change the amplitude of the actual restoration wave (ARW) comprise a set of holes formed in the nontransparent layer.

14. The method of claim 13, wherein the holes are selected from the group consisting of holes of equal or different dimensions.

15. The method of claim 5, wherein the actual digital hologram is produced in the form of an amplitude layer having local regions that change the amplitude of the actual restoration wave (ARW) and each of which corresponds to a respective second virtual unit cell.

16. The method of claim 15, wherein the actual digital hologram (ADH) comprises a transparent substrate and a nontransparent layer formed on the transparent substrate and wherein the local regions that change the amplitude of the actual restoration wave (ARW) comprise a set of holes formed in the nontransparent layer.

17. The method of claim 16, wherein the holes are selected from the group consisting of holes of equal or different dimensions.

18. The method of claim 10, wherein the size of the holes ranges from 0.6 to 0.9λ, where λ is a wavelength of the light of the first virtual light wave, second virtual light wave, and third virtual light wave and wherein said light is a monochromatic coherent light, the holes being selected from the group consisting of holes of equal or different dimensions.

19. The method of claim 10, wherein the size of the holes is equal to or greater than 1.7λ, where λ is a wavelength of the light of the first virtual light wave, second virtual light wave, and third virtual light wave and wherein said light is a monochromatic coherent light, the holes being selected from the group consisting of holes of equal or different dimensions.

* * * * *